United States Patent
Santero et al.

(10) Patent No.: US 7,349,192 B2
(45) Date of Patent: Mar. 25, 2008

(54) METHOD OF OPERATING A DEVICE FOR CONTROLLING ELECTRIC ACTUATORS WITH OPTIMUM ACTUATION CURRENT DISTRIBUTION

(75) Inventors: Paolo Santero, Orbassano (IT); Alberto Manzone, Orbassano (IT); Riccardo Groppo, Orbassano (IT)

(73) Assignee: C.R.F. Societa Consortile per Azioni (IT)

( * ) Notice: Subject to any disclaimer, the term of this patent is extended or adjusted under 35 U.S.C. 154(b) by 380 days.

(21) Appl. No.: 11/081,037

(22) Filed: Mar. 14, 2005

(65) Prior Publication Data

US 2005/0201036 A1 Sep. 15, 2005

(30) Foreign Application Priority Data

Mar. 12, 2004 (EP) ................... 04425168

(51) Int. Cl.
*H01H 47/00* (2006.01)
*H01H 47/28* (2006.01)
*H01H 47/32* (2006.01)
*H01H 9/00* (2006.01)
*H01H 51/30* (2006.01)
*F02M 51/00* (2006.01)

(52) U.S. Cl. ............... 361/139; 361/152; 361/153; 361/154; 123/490

(58) Field of Classification Search ........ 361/152–154, 361/139; 123/490
See application file for complete search history.

(56) References Cited

U.S. PATENT DOCUMENTS

| | | | | |
|---|---|---|---|---|
| 5,450,001 A | 9/1995 | Konstanzer | ............ | 323/238 |
| 5,907,466 A | 5/1999 | Dressler et al. | ............ | 361/156 |
| 5,940,262 A * | 8/1999 | Archer | ............ | 361/155 |
| 5,995,356 A * | 11/1999 | Glavmo et al. | ............ | 361/154 |
| 6,044,823 A | 4/2000 | Watanabe | ............ | 123/490 |
| 7,067,941 B2 * | 6/2006 | Honda et al. | ............ | 307/412 |

FOREIGN PATENT DOCUMENTS

| | | |
|---|---|---|
| DE | 19636507 | 3/1997 |
| DE | 10234098 | 2/2004 |
| EP | 0924589 | 6/1999 |

* cited by examiner

OTHER PUBLICATIONS

European Search Report for EP 04 42 5168 dated Aug. 13, 2004.

*Primary Examiner*—Michael Sherry
*Assistant Examiner*—Dharti H Patel
(74) *Attorney, Agent, or Firm*—Ostrolenk, Faber, Gerb & Soffen, LLP

(57) ABSTRACT

There is described a method of operating a device (1) controlling electric actuators (3), and having a pair of input terminals (4, 5) connected to an electric energy source (6, 10); a number of pairs of output terminals (7, 8), between each of which a respective electric actuator (3) is connected in use; and controlled switches (11, 12) for connecting the electric actuators (3) to the electric energy source (6, 10) independently of one another; the method including the step of controlling the controlled switches (11, 12) to supply an electric current to the electric actuators (3) via the electric energy source (6, 10). The controlling step includes the steps of: determining the possibility of a subsequent operating condition in which specific electric actuators (3) are supplied simultaneously with electric current from the electric energy source (6, 10); and temporally phase shifting the electric currents supplied to the specific electric actuators (3), to reduce the effective value of the electric current drawn from the electric energy source (6, 10).

16 Claims, 3 Drawing Sheets

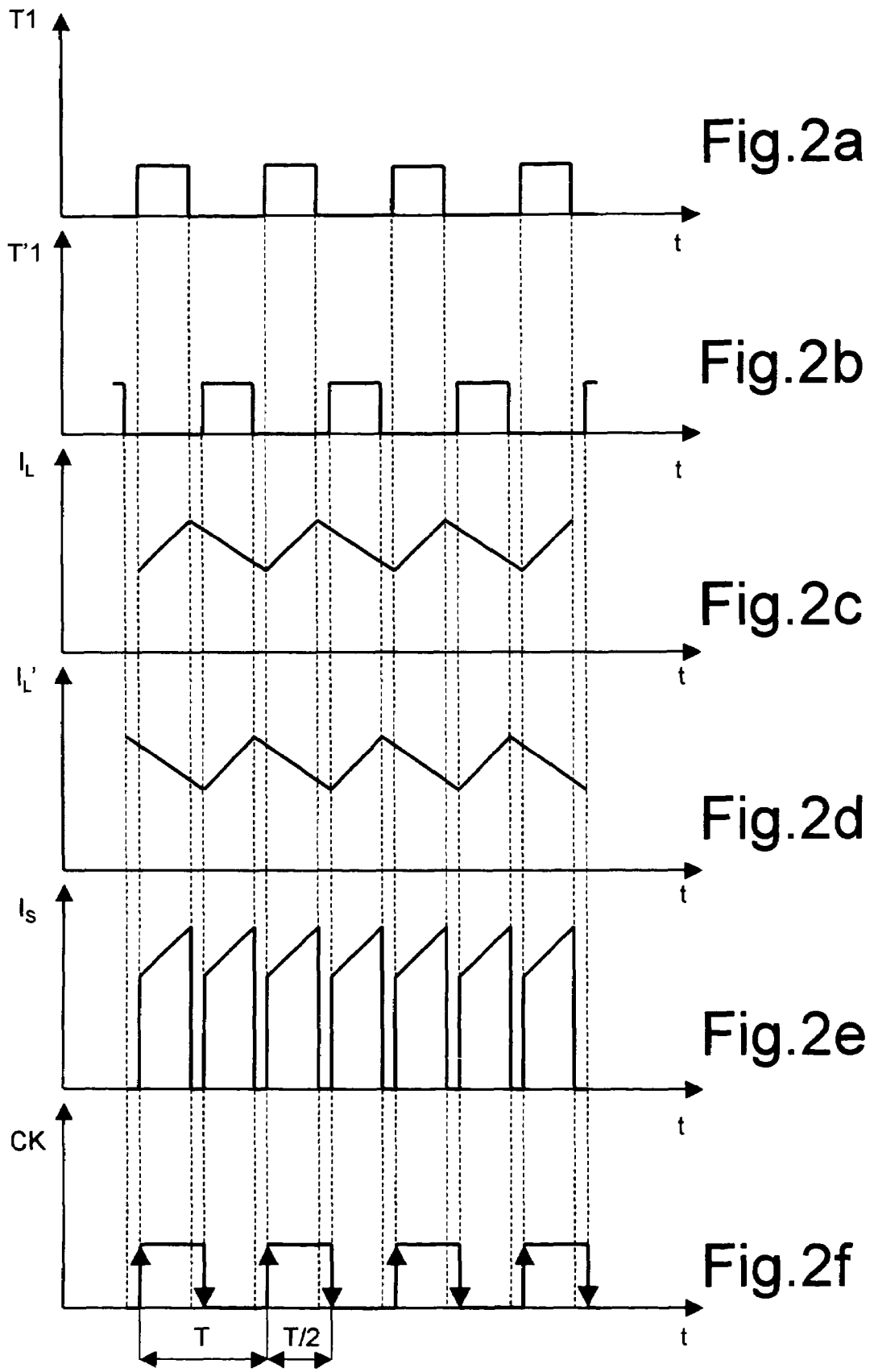

METHOD OF OPERATING A DEVICE FOR CONTROLLING ELECTRIC ACTUATORS WITH OPTIMUM ACTUATION CURRENT DISTRIBUTION

BACKGROUND OF THE INVENTION

1. Field of the Invention

The present invention relates to a method of operating a device for controlling electric actuators with optimum actuation current distribution.

2. Description of Related Art

More specifically, the present invention may be used to advantage, though not exclusively, in the control of solenoid valves controlling intake and exhaust of a vehicle internal combustion engine, e.g. an engine featuring a VVA (Variable Valve Actuation) valve control system, to which specific reference is made in the following disclosure purely by way of example. The method according to the invention, in fact, may be applied to other types of electric actuators, such as solenoid valves of ABS devices and similar, electronic injectors, etc.

More specifically, in the VVA system, an oil chamber, connected to an electrically controlled hydraulic valve (solenoid valve), is interposed between the mechanical cam and the intake and exhaust valve. When the solenoid valve is closed, actuation of the intake and exhaust valve follows the movement of the mechanical cam; and, when the solenoid valve is open, the cam partly empties the oil chamber and so disconnects actuation of the intake and exhaust valve from the mechanical cam. By appropriately controlling the solenoid valve, it is therefore possible to achieve any valve lift profile within the maximum envelope permitted by the movement of the mechanical cam, and dynamic, precise control of the amount of air and burnt gases inside the combustion chamber.

European Patent EP 0 924 589 filed by the present Applicant relates to a device for controlling electric actuators, and which, in particular, controls a number of inductive electric actuators connected in parallel between the same power line and the same ground line by respective controlled electronic switches.

More specifically, the power line is connected by an external cable to a voltage source, e.g. the vehicle battery (typically supplying 13.5 V), and is also connected to a capacitor bank.

In the above control device, the electric actuator actuation current profile is PWM (Pulse Width Modulation) regulated. More specifically, the controlled electronic switch connecting the respective electric actuator to the power line is PWM controlled when the current circulating in the electric actuator is to be maintained about a predetermined actuation value.

The mean current demand of the electric actuator can roughly be shown to be supplied directly by the voltage source—in the example described, by the vehicle battery—over the external cable, while the rest of the current ("ripple" current) is supplied by the capacitor bank according to the equation:

$$I_{Crms} = \sqrt{I_{Lrms}^2 - I_{Lmean}^2}$$

where:

$I_{Crms}$ is the effective value of the current circulating in the capacitor bank;

$I_{Lrms}$ is the effective value of the current circulating in the electric actuator; and $I_{Lmean}$ is the mean value of the current circulating in the electric actuator.

The electric actuators can be activated fully independently by the control device, so that, in certain operating conditions, actuation may overlap or be completely superimposed in time.

In which case, the current demands of simultaneously activated electric actuators may be summed, thus resulting in a considerable increase in the effective current $I_{Crms}$ required of the capacitor bank.

Since the capacitor bank is designed on the basis of the effective current circulating in it, the increase in effective current $I_{Crms}$ therefore calls for using large, high-cost capacitors.

BRIEF SUMMARY OF THE INVENTION

It is an object of the present invention to provide a method of operating the control device of the electric actuators, designed to eliminate the aforementioned drawback.

According to the present invention, there is provided a method of operating a device controlling electric actuators, and comprising a pair of input terminals connected in use to an electric energy source; a number of pairs of output terminals, between each of which a respective electric actuator is connected in use; and controlled switching means for connecting said electric actuators to said electric energy source independently of one another; said method comprising the step of controlling said controlled switching means to supply an electric current to said electric actuators via said electric energy source; characterized in that said controlling step comprises the steps of: determining the possibility of a subsequent operating condition in which specific electric actuators are supplied simultaneously with electric current from said electric energy source; and temporally phase shifting the electric currents supplied to said specific electric actuators, to reduce the effective value of the electric current drawn from said electric energy source.

BRIEF DESCRIPTION OF THE DRAWINGS

A preferred, non-limiting embodiment of the present invention will be described by way of example with reference to the accompanying drawings, in which:

FIGS. 2a-2f show time graphs of electric quantities relating to the FIG. 1 control device;

DETAILED DESCRIPTION OF THE INVENTION

Figure 1:
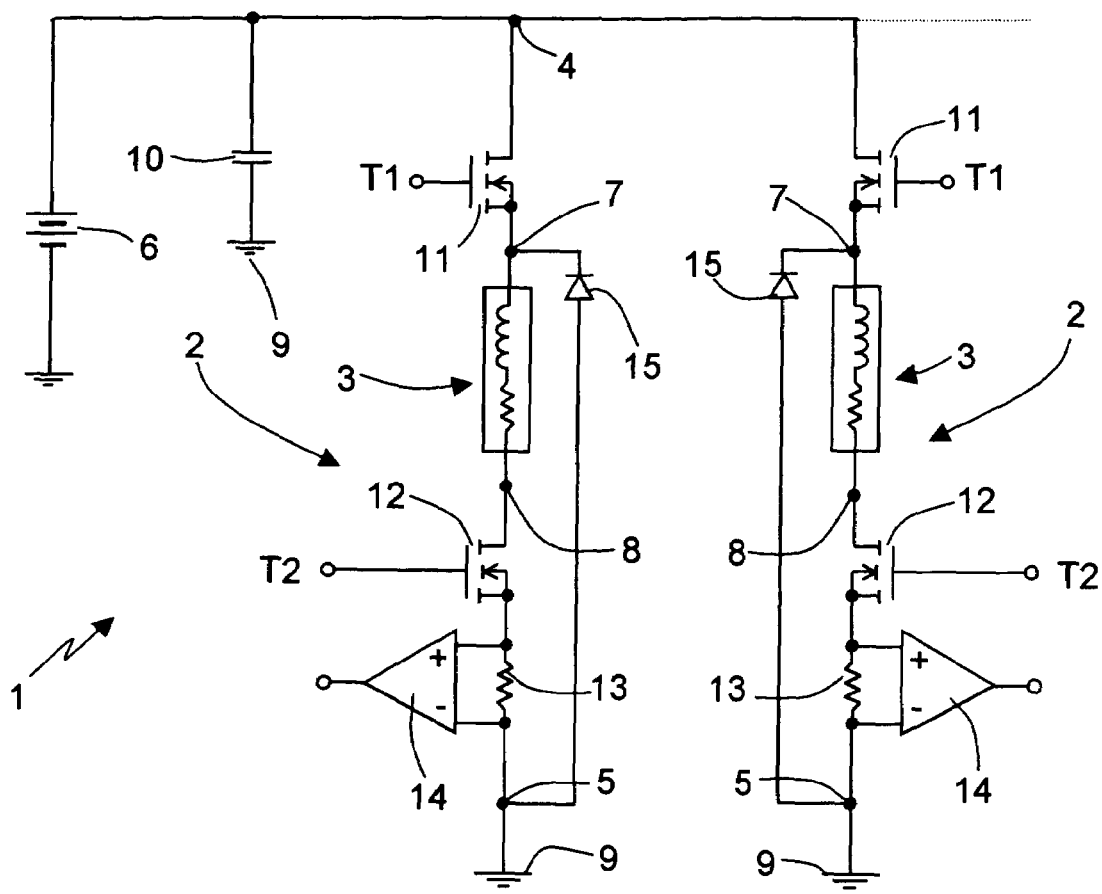
FIG. 1 shows a circuit diagram of an electric actuator control device.

As shown in FIG. 1, the control device, indicated as a whole by 1, comprises a number of control circuits 2, one for each electric actuator 3. For the sake of simplicity, FIG. 1 shows only two control circuits 2 relative to two respective electric actuators 3, each of which is shown in FIG. 1 by a corresponding equivalent circuit defined by a resistor and an inductor connected in series (for example, the resistor may have a value of 270 mΩ, and the inductor a value of 1.4 mH).

Each control circuit 2 comprises a first and a second input terminal 4, 5 connected respectively to the positive pole and negative pole of a power source, e.g. a vehicle battery 6, supplying a voltage $V_{BATT}$ of a nominal value of typically 13.5 V; and a first and a second output terminal 7, 8, between which relative electric actuator 3 is connected. The negative pole of battery 6 is connected to a ground line 9 of control device 1, and a battery capacitor 10 is connected between first input terminal 4 and ground line 9. The terminal of each electric actuator 3 connected to first output terminal 7 is typically referred to as the "highside" (HS) terminal, and the terminal of each electric actuator 3 connected to second output terminal 8 is typically referred to as the "lowside" (LS) terminal.

Each control circuit 2 also comprises a first and a second MOS transistor 11, 12. The first MOS transistor 11 has a gate terminal receiving a first control signal T1 from an engine central control unit (not shown); a drain terminal connected to first input terminal 4; and a source terminal connected to first output terminal 7. The second MOS transistor 12 has a gate terminal receiving a second control signal T2 from the engine central control unit; a drain terminal connected to second output terminal 8; and a source terminal connected to ground line 9 via a detecting stage. The detecting stage is defined by a detecting resistor 13, the terminals of which are connected to the inputs of an operational amplifier 14 generating a voltage proportional to the current flow in detecting resistor 13.

First and second MOS transistors 11 and 12 are referred to respectively as "highside" and "lowside" transistors, by being connecting respectively to the highside and lowside terminals of respective electric actuators 3.

Each control circuit 2 also comprises a so-called "free-wheeling" diode 15 having the anode connected to input terminal 5, and the cathode connected to first output terminal 7. Alternatively, diode 15 may be replaced by a third MOS transistor (not shown) acting as a synchronous rectifier.

Each control circuit 2 has three operating modes characterized by a different pattern of the current circulating in electric actuator 3: a charge mode, in which current increases to a given hold value; a hold mode, in which current oscillates with a roughly saw-tooth pattern about the value reached in the preceding step; and a discharge mode, in which current decreases from the value assumed in the preceding step to a final value, which may even be zero.

Figure 3:
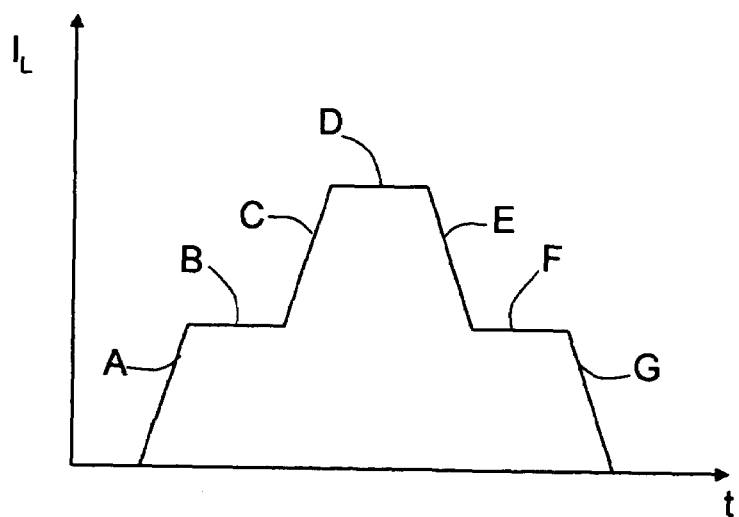
FIG. 3 shows a time graph of the mean current circulating in one of the FIG. 1 electric actuators.

As is known, by alternating and repeating the above three modes, each electric actuator 3 can be supplied with current with a time pattern as shown in FIG. 3, and which comprises: a first rise portion A increasing to a first hold value; a first hold portion B, in which the amplitude of the current oscillates about the first hold value; a second rise portion C increasing to a second hold value; a second hold value D, with an amplitude oscillating about the second hold value; a first fall portion E decreasing to a third hold value, possibly coinciding with the first hold value; a third hold portion F with an amplitude oscillating about the third hold value; and a second fall portion G decreasing to a value of approximately zero. For the sake of simplicity in FIG. 3, the hold portions are shown by line segments coinciding with the respective hold value.

More specifically, at each rise portion A and C, first and second MOS transistors 11 and 12 are kept closed by respective control signals T1 and T2, so that the battery voltage VBATT is applied to the terminals of electric actuator 3, and current flows in the loop comprising battery 6, first MOS transistor 11, electric actuator 3, second MOS transistor 12, and detecting resistor 13, and increases exponentially with time. At this step, electric actuator 3 draws energy from battery 6.

At each hold portion B, D and F, second MOS transistor 12 is kept closed by relative control signal T2, while first MOS transistor 11 is closed and opened repeatedly, so that battery voltage $V_{BATT}$ (when first MOS transistor 11 is closed) and a zero voltage (when first MOS transistor 11 is open) are applied alternately to the terminals of electric actuator 3.

In the first case (first MOS transistor 11 closed), electric actuator 3 draws energy from battery 6, and current flows in the loop comprising battery 6, first MOS transistor 11, electric actuator 3, second MOS transistor 12, and detecting resistor 13, and increases exponentially with time, but in a manner which is roughly substantially linear.

Conversely, in the second case (first MOS transistor 11 open), electric actuator 3 releases energy, and current flows in the loop comprising electric actuator 3, second MOS transistor 12, detecting resistor 13, and free-wheeling diode 15, and decreases exponentially with time, but in a manner which is roughly substantially linear.

More specifically, at hold portions B, D, F, first MOS transistor 11 is PWM controlled by relative control signal T1, which is defined by a train of pulses with a predetermined period T, and a duty cycle D open- or closed-loop regulated by the engine central control unit (not shown) to keep the current in electric actuator 3 around the respective hold value.

More specifically, in the case of open-loop control, the close time of first MOS transistor 11 (PWM ON), i.e. the duty cycle D of control signal T1, is calculated beforehand on the basis of circuit parameters, and in particular on the basis of the value of battery voltage $V_{BATT}$ and the equivalent resistance R of electric actuator 3, according to the following equation:

$$D = \frac{I_L \cdot R}{V_{BATT}}$$

where $I_L$ is the current circulating in electric actuator 3.

Conversely, in the case of closed-loop control, the value of the current $I_L$ circulating in electric actuator 3 is monitored by means of the current detecting stage defined by detecting resistor 13 and operational amplifier 14, so as to appropriately time the PWM ON and OFF phases accordingly.

More specifically, closed-loop control may be implemented by controlling the maximum or minimum value of the current $I_L$ circulating in electric actuator 3.

In the first case, i.e. controlling the maximum value of current $I_L$, first MOS transistor 11 is first closed (PWM ON) by control signal T1 upon arrival of a sync signal, so that current $I_L$ starts to rise. The sync signal may, for example, be an internal clock signal CK of the engine central control unit, with an appropriate period equal to period T of the PWM control signal. Current $I_L$ is then measured using the current detecting stage, and, upon current $I_L$ reaching a predetermined maximum value, first MOS transistor 11 is opened (PWM OFF), and current $I_L$ starts to fall. Subsequently, upon arrival of the next sync signal, first MOS transistor 11 is again closed (next PWM ON phase) and so on.

In the second case, i.e. controlling the minimum value of current $I_L$, first MOS transistor 11 is opened (PWM OFF) upon arrival of the sync signal, so that current $I_L$ in electric actuator 3 starts to fall. Upon current $I_L$ reaching a predetermined minimum value, first MOS transistor 11 is closed (PWM ON), and current $I_L$ starts to rise. Subsequently, upon arrival of the next sync signal, first MOS transistor 11 is again opened (PWM OFF) and so on.

At fall portion E, first MOS transistor 11 is kept permanently open, while second MOS transistor 12 is kept closed, so that current $I_L$ in electric actuator 3 decreases exponentially, and electric actuator 3 releases part of the energy previously drawn from battery 6.

Finally, at fall portion G, first MOS transistor 11 and second MOS transistor 12 are kept permanently open; second MOS transistor 12 "breaks down", so that current $I_L$ in electric actuator 3 falls rapidly and exponentially, and electric actuator 3 again releases part of the energy previously drawn from battery 6.

The duration of the rise and fall portions can be determined by the engine central control unit using the logic signal supplied by operational amplifier 14 connected to the terminals of detecting resistor 13 and indicating the value of the current $I_L$ flowing in electric actuator 3.

According to one aspect of the present invention, at hold portions B, D, F, control signals T1, which provide for PWM controlling turn-on and turn-off of first MOS transistors 11 of simultaneously supplied electric actuators 3, are appropriately phase shifted with respect to a common sync signal—clock signal CK, so as to reduce the effective current $I_{Crms}$ circulating in battery capacitor 10, by eliminating or greatly reducing the time intervals in which the current demands of two or more simultaneously activated electric actuators 3 are summed (during respective PWM ON phases).

This is shown more clearly in FIG. 2, which relates to control device 1 simultaneously controlling two electric actuators 3 hereinafter referred to as first and second electric actuator 3. What is said relative to this particular case, however, may safely be applied to n number of electric actuators controlled simultaneously by control device 1, as explained in more detail later on.

With reference first to FIG. 2f, the clock signal CK is used by the engine central control unit as a sync signal for controlling electric actuators 3.

On determining in known manner that the first and second electric actuator 3 are to be activated simultaneously, with the result that both would demand current simultaneously, the engine central control unit provides for appropriately phase shifting relative control signals T1 with respect to clock signal CK.

More specifically, control signal T1 (FIG. 2a) of first electric actuator 3 is made synchronous with clock signal CK, while the control signal of second electric actuator 3—hereinafter indicated T1' (FIG. 2b)—is phase shifted by a half period (T/2) with respect to clock signal CK, so that the PWM ON phase of signal T1 starts at the leading edge of clock signal CK, while the PWM ON phase of signal T1' starts at the trailing edge of clock signal CK.

In FIGS. 2c and 2d, $I_L$ and $I_L'$ respectively indicate the currents circulating in first electric actuator 3 relative to control signal T1, and in second electric actuator 3 relative to control signal T1'. As can be seen, and as explained previously, currents $I_L$ and $I_L'$ rise at the relative PWM ON phase, and fall at the subsequent OFF phase to produce a saw-tooth pattern about the desired hold value.

The current (referred to as supply current) circulating in the first and second electric actuator 3 at the PWM ON phases is supplied by battery 6 and battery capacitor 10, and is indicated $I_S$ in FIG. 2e. Each PWM ON phase corresponds to a roughly trapezoidal supply current pulse of a duration equal to the PWM ON phase, and of an amplitude equal to the current $I_L$ circulating in electric actuators 3. More specifically, the current demands of the two electric actuators 3 are summed during the respective PWM ON phases.

As shown in FIG. 2, the PWM ON phases of the first and second electric actuator 3 do not overlap at all if the PWM duty cycle DC is less than 50%, so that currents $I_L$ and $I_L'$ circulating in electric actuators 3 are not summed; or else they overlap for the minimum length of time possible if the PWM duty cycle DC is just over 50%, so that currents $I_L$ and $I_L'$ circulating in electric actuators 3 are summed for a minimum length of time.

As can be seen, by appropriately phase shifting control signals T1 and T1' with respect to clock signal CK, the mean value of supply current $I_S$ is close to the effective value of supply current $I_S$, thus greatly reducing the value of the effective current $I_{Crms}$ in battery capacitor 10.

More specifically, in the FIG. 2a-2f example shown of two electric actuators 3 with respective PWM control signals T1 and T1' with a duty cycle of D and a 50% phase shift (phase opposition), the effective current $I_{Crms}$ in battery capacitor 10 is expressed by the following equation:

$$I_{Crms} = \frac{1}{2}I_M\left(\left(1 - \text{sign}\left(D - \frac{1}{2}\right)\right)\sqrt{2D|1-2D|} + \left(1 - \text{sign}\left(\frac{1}{2} - D\right)\right)\sqrt{|2D-1||2-2D|}\right)$$

where $I_M$ is the mean value of the current circulating in one period in one electric actuator 3.

Conversely, when PWM control signals T1 and T1' of the two electric actuators 3 have a zero phase shift (in phase), the effective current $I_{Crms}$ in the battery capacitor is expressed by the following equation:

$$I_{Crms} = 2I_M\sqrt{D(1-D)}$$

Figure 4:
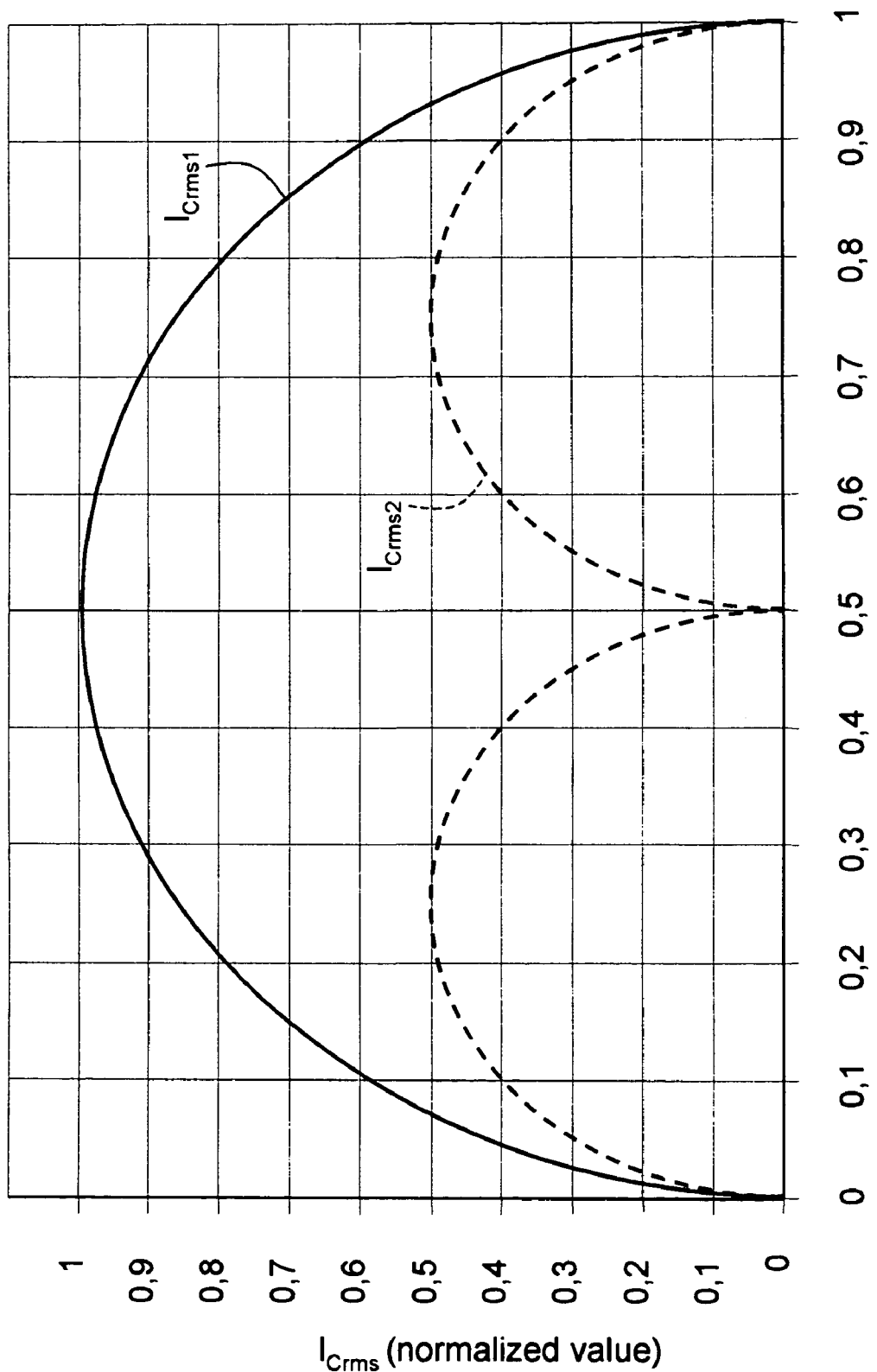
FIG. 4 shows a graph of electric quantities relating to the FIG. 1 circuit.

The above equations are shown in the FIG. 4 graph, which clearly shows the advantage of phase-opposition control (curve $I_{Crms2}$ in FIG. 4) with respect to in-phase control ($I_{Crms1}$ in FIG. 4), in terms of reducing the effective current $I_{Crms}$ in battery capacitor 10, alongside a variation in the duty cycle D of the PWM control signal.

What is stated above applies equally well to n electric actuators 3 PWM-controlled simultaneously by control device 1; in which case, the respective control signals T1 of electric actuators 3 are appropriately phase shifted with respect to one another by the engine central control unit by a time interval T/n with respect to the clock signal CK.

According to a further aspect of the present invention, the clock signal CK is appropriately frequency modulated by "spread spectrum modulation" to frequency modulate all the PWM's controlling the electric actuators. More specifically, the frequency of the clock signal CK is modulated linearly from a minimum to a maximum value appropriately selected in quantized steps.

Electromagnetic emissions (radiated and conducted) caused by driving the electric actuators are thus distributed in a frequency band whose amplitude depends on the amplitude of the modulation. The resulting emission spectrum is therefore wider but lower in value, which greatly improves electromagnetic emissions of control device 1, as compared with a constant frequency of the sync signal.

In fact, if M is the number of quantization intervals between the minimum and maximum clock signal frequency value, the energy peak associated with the nominal frequency value of clock signal CK is divided between M peaks associated with the various modulation-generated frequency values.

More specifically, the so-called "Spread Spectrum" modulation technique—originally used for military purposes by being highly immune to electromagnetic interference—is based on the principle of distributing signal energy over a wide band of frequencies, and, in particular, provides for modulating signals twice: a first time by conventional modulation, e.g. PSK (Phase Shift Keying), FSK (Frequency Shift Keying), etc., and a second time by wide-band modulation, e.g. FH (Frequency Hopping), DS (Direct Sequence), or FHDS (a cross of the first two).

More detailed information about the "Spread Spectrum" technique can be found in "1996 Wireless Communications Design Seminar Handbook" published by Harris Semiconductors.

The advantages of the present invention will be clear from the foregoing description.

In particular, appropriately phase shifting the control signals of the various electric actuators provides for reducing the effective current circulating in the battery capacitor, which may thus be smaller and cheaper.

Moreover, frequency modulating the PWM sync signal greatly reduces electromagnetic emissions (radiated and conducted) of the control device of the electric actuators.

Clearly, changes may be made to what described and illustrated herein without, however, departing from the scope of the present invention as defined in the accompanying claims.

In particular, it should be pointed out that the concept of appropriately phase shifting the currents supplied to simultaneously controlled electric actuators may also be applied to other control phases, other than the hold phase, of the electric actuators. In particular, it may be applied to all phases involving simultaneous current demand from the power source by a number of electric actuators.

Moreover, though the method according to the invention is described with reference to PWM control of the highside transistor of the control circuit of the electric actuators, the same considerations also apply to PWM control of the lowside transistor.

The invention claimed is:

1. A method of operating a device (1) controlling electric actuators (3), and comprising a pair of input terminals (4, 5) connected in use to an electric energy source (6, 10); a number of pairs of output terminals (7, 8), between each of which a respective electric actuator (3) is connected in use; and controlled switching means (11, 12) for connecting said electric actuators (3) to said electric energy source (6, 10) independently of one another; said method comprising the step of controlling said controlled switching means (11, 12) to supply an electric current to said electric actuators (3) via said electric energy source (6, 10);
characterized in that said controlling step comprises the steps of:
determining the possibility of a subsequent operating condition in which specific electric actuators (3) are supplied simultaneously with electric current from said electric energy source (6, 10); and
temporally phase shifting the electric currents supplied to said specific electric actuators (3), to reduce the effective value of the electric current drawn from said electric energy source (6, 10).

2. A method as claimed in claim 1, wherein said controlling step comprises the step of supplying said controlled switching means (11, 12), in given operating conditions, with a control signal (T1, T2) comprising a train of pulses having a period T; each of said pulses being associated with a time interval in which said electric actuators (3) draw electric current from said electric energy source (6, 10).

3. A method as claimed in claim 2, wherein the electric current circulating in said electric actuators (3) in said given operating conditions has a pattern comprising a succession of rise portions followed by fall portions; said succession defining a pattern of said current oscillating about a desired value.

4. A method as claimed in claim 2, wherein said phase shifting step comprises the step of supplying the controlled switching means (11, 12) associated with said specific electric actuators (3) with respective control signals (T1, T2) phase shifted differently with respect to a common sync signal (CK).

5. A method as claimed in claim 2, wherein said control signal (T1, T2) is pulse width modulated (PWM).

6. A method as claimed in claim 4, wherein said sync signal (CK) has period T.

7. A method as claimed in claim 4, wherein said control signals (T1, T2) are phase shifted with respect to one another by a time interval of T/N; N being the number of said specific electric actuators (3).

8. A method as claimed in claim 4, and also comprising the step of frequency modulating said sync signal (CK).

9. A method as claimed in claim 8, wherein said step of frequency modulating said sync signal (CK) comprises the step of spread spectrum modulating said sync signal (CK).

10. A method as claimed in claim 2, and comprising the step of open-loop determining the duration of said time interval.

11. A method as claimed in claim 2, and comprising the step of closed-loop determining the duration of said time interval.

12. A method as claimed in claim 11, wherein the step of closed-loop determining the duration of said time interval comprises the step of controlling the maximum value of the electric current circulating in said electric actuators (3).

13. A method as claimed in claim 11, wherein the step of closed-loop determining the duration of said time interval comprises the step of controlling the minimum value of the electric current circulating in said electric actuators (3).

14. A method as claimed in claim 1, wherein said electric currents supplied to said specific electric actuators (3) do not overlap temporally.

15. A method as claimed in claim 1, wherein said controlled switching means (11, 12) are connected between one terminal in said pair of input terminals (4, 5) and a respective terminal in said pair of output terminals (7, 8).

16. A method as claimed in claim 1, wherein said electric energy source comprises a voltage source (6); and capacitor means (10) connected to the terminals of said voltage source (6).

* * * * *